(12) United States Patent
Joshi et al.

(10) Patent No.: US 7,705,390 B2
(45) Date of Patent: Apr. 27, 2010

(54) DUAL BIT FLASH MEMORY DEVICES AND METHODS FOR FABRICATING THE SAME

(75) Inventors: Amol Ramesh Joshi, Sunnyvale, CA (US); Ning Cheng, San Jose, CA (US); Minghao Shen, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 8 days.

(21) Appl. No.: 12/054,081

(22) Filed: Mar. 24, 2008

(65) Prior Publication Data

US 2008/0169502 A1     Jul. 17, 2008

Related U.S. Application Data

(62) Division of application No. 11/538,404, filed on Oct. 3, 2006, now Pat. No. 7,368,347.

(51) Int. Cl.
*H01L 21/76*   (2006.01)
*H01L 21/792*  (2006.01)

(52) U.S. Cl. .............. 257/314; 257/324; 257/E29.309

(58) Field of Classification Search ......... 257/314–316, 257/324, E29.129, E29.309, 326, E29.109
See application file for complete search history.

(56) References Cited

U.S. PATENT DOCUMENTS

| | | | |
|---|---|---|---|
| 6,329,687 B1 | 12/2001 | Sobek et al. | |
| 6,639,271 B1 | 10/2003 | Zheng et al. | |
| 6,653,190 B1 | 11/2003 | Yang et al. | |
| 6,723,603 B2 | 4/2004 | Liu et al. | |
| 6,861,307 B2 | 3/2005 | Zheng et al. | |
| 6,917,068 B1 | 7/2005 | Krivokapic | |
| 6,987,298 B2* | 1/2006 | Lee et al. | 257/324 |
| 7,170,132 B2* | 1/2007 | Ogura et al. | 257/324 |
| 7,265,410 B2* | 9/2007 | Kang et al. | 257/315 |
| 2004/0021172 A1 | 2/2004 | Zheng et al. | |
| 2005/0145928 A1* | 7/2005 | Ogura et al. | 257/324 |
| 2006/0097306 A1* | 5/2006 | Kim et al. | 257/315 |
| 2006/0211188 A1 | 9/2006 | Lusky et al. | |
| 2007/0205454 A1 | 9/2007 | Cheung et al. | |
| 2008/0149988 A1* | 6/2008 | Kinoshita et al. | 257/315 |

* cited by examiner

*Primary Examiner*—Tuan N. Quach

(57) ABSTRACT

Methods for fabricating dual bit flash memory devices are provided. Method steps include forming a charge trapping layer overlying a substrate and fabricating two insulating members overlying the charge trapping layer. A polycrystalline silicon layer is provided overlying the charge trapping layer and about sidewalls of the insulating members. Sidewall spacers are formed overlying the polycrystalline silicon layer and about the sidewalls of the insulating members. A portion of the first polycrystalline silicon layer and a first portion of the charge trapping layer are removed. A first insulating layer is conformally deposited overlying the insulating members and the substrate. A gate spacer is formed between the two insulating members and overlying the first insulating layer. The two insulating members are removed and the charge trapping layer is etched to form charge storage nodes. Impurity dopants are implanted into the substrate to form impurity-doped bitline regions within the substrate.

6 Claims, 5 Drawing Sheets

DUAL BIT FLASH MEMORY DEVICES AND METHODS FOR FABRICATING THE SAME

CROSS-REFERENCE TO RELATED APPLICATION

This application is a divisional of U.S. patent application Ser. No. 11/538,404, filed Oct. 3, 2006, U.S. Pat. No. 7,368,347.

FIELD OF THE INVENTION

The present invention generally relates to flash memory devices, and more particularly relates to dual bit memory device, and methods for fabricating dual bit memory devices, with charge storage nodes having substantially vertical sidewalls.

BACKGROUND OF THE INVENTION

A type of commercially available flash memory product is a MirrorBit® memory device available from Spansion, LLC, located in Sunnyvale, Calif. A MirrorBit cell effectively doubles the intrinsic density of a flash memory array by storing two physically distinct bits on opposite sides of a memory cell. Each bit within a cell can be programmed with a binary unit of data (either a logic one or zero) that is mapped directly to the memory array.

A portion of an exemplary MirrorBit® memory device 10, illustrated in FIG. 1, includes a P-type semiconductor substrate 12 within which are formed spaced-apart source/drain regions 14, 16 respectively (both typically having N-type conductivity), otherwise known as bitline regions or bitlines. A charge trapping stack 18 is disposed on the top surface of the substrate between the bitlines. The charge trapping stack 18 typically comprises, for example, a charge trapping layer, often a silicon nitride layer 20, disposed between a first or bottom insulating layer 22, such as a silicon dioxide layer (commonly referred to as a tunnel oxide layer), and a second or top insulating layer 24. A gate electrode 26, which typically comprises an N or N+ polycrystalline silicon layer, is formed over the charge trapping stack. An isolation region or gate insulator 40 divides the charge trapping stack below each gate electrode 26 to form a first charge storage node or bit 28 and a complementary second charge storage node or bit 30 of memory cells 32 and 34.

As devices densities increase and product dimensions decrease, it is desirable to reduce the size of the various structures and features associated with individual memory cells, sometimes referred to as scaling. However, the fabrication techniques used to produce flash memory arrays limit or inhibit the designer's ability to reduce device dimensions. For example, with 65 nm node devices, it is not necessary to isolate portions of the charge trapping layer of complimentary bits, that is, gate insulators 40 in cells 32 and 34 are not necessary. However, as device dimensions decrease to 45 nm nodes, isolation of the charge trapping layer portions of the complimentary nodes by gate insulator 40 becomes advantageous. In addition, it is difficult to achieve the desired charge trapping stack thickness in the charge storage nodes independently of the thickness of the gate insulator separating the storage nodes. Further, as charge storage nodes become narrower, variations in the length of the nodes have more deleterious effects on the charge storage characteristics of the nodes. Moreover, charge storage nodes fabricated with less than substantially vertical sidewalls can result in "shadowing" that effect subsequent etching processes.

Accordingly, it is desirable to provide methods of fabricating dual bit memory devices with design flexibility. In addition, it is desirable to provide methods of fabricating flash memory devices that can be scaled with device dimensions. It is also desirable to provide memory devices with substantially vertical sidewalls. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with an exemplary embodiment of the present invention, a method for fabricating a dual bit memory device comprises forming a charge trapping layer overlying a substrate. Two insulating members are fabricated overlying the charge trapping layer and a first polycrystalline silicon layer is provided overlying the charge trapping layer and about a first portion of sidewalls of the two insulating member. Sidewall spacers are formed overlying the first polycrystalline silicon layer and about a second portion of the sidewalls of the two insulating members. Using the sidewall spacers as an etch mask, a portion of the first polycrystalline silicon layer and a first portion of the charge trapping layer are removed and a first portion of the substrate is exposed. A first insulating layer is conformally deposited overlying the insulating members and the exposed first portion of the substrate and a polycrystalline spacer is formed between the two insulating members and overlying the first insulating layer. The two insulating members are removed and a second portion of the charge trapping layer is etched to form charge storage nodes and to expose a second portion of the substrate. Impurity dopants are implanted into the second portion of the substrate to form impurity-doped bitline regions within the substrate. The impurity-doped bitline regions are in electrical communication with the charge storage nodes.

In accordance with another exemplary embodiment of the present invention, a method for fabricating a dual bit memory device comprises providing a charge trapping layer overlying a substrate and fabricating two insulating members overlying a first portion of the charge trapping layer. Polycrystalline silicon gate structures are formed overlying a second portion of the charge trapping layer and adjacent sidewalls of the two insulating members. The polycrystalline silicon gate structures are formed having substantially vertical sidewalls. A third portion of the charge trapping layer is removed and a first portion of the substrate is exposed. A first insulating layer is conformally deposited overlying the insulating members and the exposed first portion of the substrate and proximate to the substantially vertical exposed sidewalls of the polycrystalline gate structures. A gate spacer is formed between the two insulating members overlying the first insulating layer and the two insulating members are removed. The first portion of the charge trapping layer is removed and a second portion of the substrate is exposed. Impurity doped bitline regions are formed within the substrate and a second insulating layer is deposited overlying the bitline regions, the gate spacer, and the gate structures. A portion of the second insulating layer is removed to expose the gate spacer and the gate structures and a first polycrystalline silicon layer is formed overlying and in contact with the gate spacer and the gate structures.

In accordance with a further exemplary embodiment of the present invention, a nonvolatile semiconductor memory device comprises a semiconductor substrate and two spaced-apart charge storage nodes disposed on the substrate. Two spaced-apart bitline regions are disposed within the substrate. Each of the two bitline regions is in electrical contact with one of the two charge storage nodes. A gate insulator is disposed on the substrate between the two charge storage nodes and a gate spacer is disposed on the gate insulator and between the two charge storage nodes. A word line is in physical contact with the gate spacer and the two charge storage nodes.

In accordance with yet another exemplary embodiment of the present invention, a nonvolatile semiconductor memory device comprises a semiconductor substrate and a first and a second multi-layer stack. Each multi-layer stack comprises a first silicon oxide layer disposed on the substrate, a silicon nitride layer disposed on the first silicon oxide layer, and a second silicon oxide layer disposed on the silicon nitride layer. A first gate structure overlies the first multi-layer stack and a second gate structure overlies the second multi-layer stack. The first multi-layer stack and first gate structure form a first charge storage node and the second multi-layer stack and second gate structure form a second charge storage node. A gate insulator is disposed overlying the substrate between the first and second charge storage nodes and a gate spacer is disposed overlying the gate insulator and between the first and second charge storage nodes. A first bitline region is disposed in the substrate and is in electrical communication with the first charge storage node. A second bitline region is disposed in the substrate and is in electrical communication with the second charge storage node.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

In accordance with various exemplary embodiments of the present invention, FIGS. 2-14 illustrate method steps for fabricating a dual bit memory device 50 that can be scaled with decreased device dimensions. The methods provide for flexibility in the design of the charge trapping stacks of the device and also the gate insulator. By using sidewall spacers as etch masks, the length of the charge storage nodes of the device can be free from lithography variations. In addition, by fabricating the polycrystalline silicon gate structures overlying the charge trapping stacks of the device with substantially vertical sidewalls, variations in the length of the charge storage nodes can be minimized. Interference by the charge storage nodes with subsequent etching processes also can be reduced. FIGS. 2-14 illustrate various cross-sectional views of dual bit memory device 50. Various steps in the manufacture of dual bit memory device 50 are well known and so, in the interest of brevity, many conventional steps will only be mentioned briefly herein or will be omitted entirely without providing well known process details.

Figure 1:
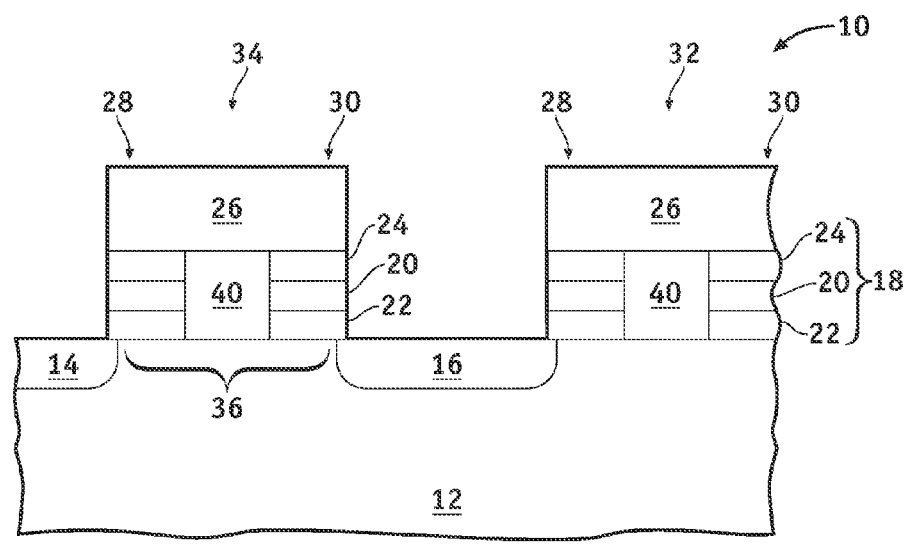
FIG. 1 is a cross-sectional view of a portion of a Mirror-Bit® dual bit memory device available from Spansion, LLC.
Figure 2:
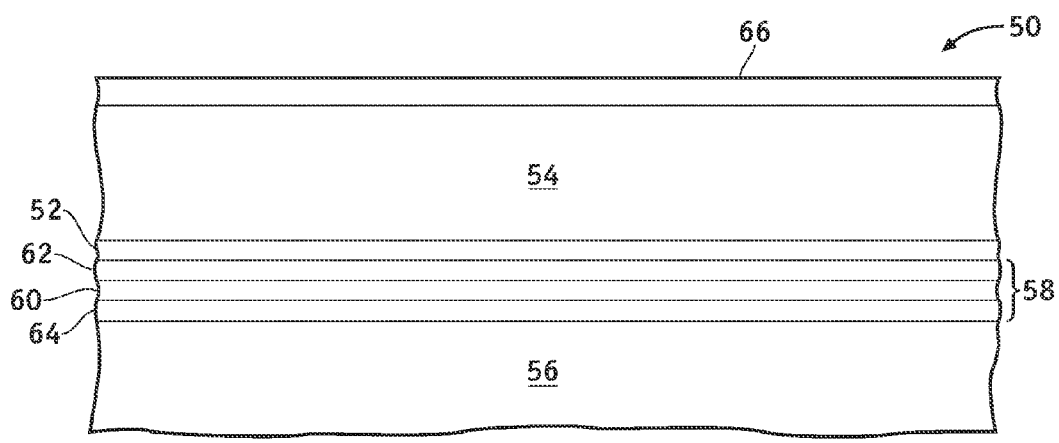
FIGS. 2-14 are cross-sectional views taken along the same axis that illustrate methods for fabricating a dual bit flash memory device in accordance with exemplary embodiments of the present invention.

As illustrated in FIG. 2, the manufacture of dual bit memory device 50 begins by providing a silicon substrate 56. As used herein, the term "silicon substrate" will be used to encompass the relatively pure silicon materials typically used in the semiconductor industry as well as silicon admixed with other elements such as germanium, carbon, and the like. The term "silicon substrate" also is used to encompass the substrate itself together with metal or insulator layers that may overly the substrate. Silicon substrate 56 may be a bulk silicon wafer or a thin layer of silicon on an insulating layer (commonly known as a silicon-on-insulator wafer or SOI wafer) that, in turn, is supported by a silicon carrier wafer.

A first insulating layer 64 and a charge trapping layer 60 of a multi-layer dielectric-charge trapping-dielectric stack 58 are formed overlying substrate 56. Preferably insulating layer 64 is a layer of silicon dioxide having a thickness of about 3-10 nanometers (nm), more preferably about 5 nm. Layer 64 can be a thermally grown layer of silicon dioxide or can be deposited, for example, by low pressure chemical vapor deposition (LPCVD). Thin insulator layer 64 is often referred to as a tunnel oxide layer, a layer through which programming or erasing charge carriers can tunnel. Charge trapping layer 60 can be, for example, a layer of silicon nitride, silicon-rich silicon nitride, polycrystalline silicon, a combination of these, or any of the other well known charge trapping materials. Stoichiometric silicon nitride is $Si_xN_y$ for which x=3 and n=4; silicon-rich silicon nitride is a silicon/nitrogen material for which x/y is greater than ¾. Charge trapping layer 60 can be deposited, for example, to a thickness of about 7 to 15 nm by chemical vapor deposition (CVD), plasma enhanced chemical vapor deposition (PECVD), LPCVD, or by atomic layer deposition (ALD). The layers comprising stack 58 can be any suitable multi-layer dielectric-charge trapping-dielectric stack comprising first insulating layer 64, silicon nitride layer 60 overlying first insulating layer 64, and a second insulating layer 62 overlying silicon nitride layer 60. Preferably, second insulating layer 62 comprises a silicon oxide. In an exemplary embodiment of the invention, multi-layer stack 58 has a total thickness that is no greater than about 25 nm. The silicon oxide layers can be deposited, for example, from either a tetraethylorthosilicate (TEOS) or $SiH_4$ (silane) source or can be grown thermally from silicon, silicon nitride, or silicon-rich silicon nitride. The silicon nitride or silicon-rich silicon nitride can be deposited, for example, from the reaction of dichlorosilane and ammonia.

As illustrated in FIG. 2, a first polycrystalline silicon layer 52 is deposited overlying multi-layer stack 58. In a preferred embodiment, first polycrystalline silicon layer 52 has a thickness in the range of about 5 to about 20 nm, preferably about 10 nm. Polycrystalline silicon layer 52 can be deposited, for example, from the reduction of silane. An insulating layer 54 is formed overlying first polycrystalline silicon layer 52. Insulating layer 54 may comprise any suitable material that is has a different etch rate from that of first polycrystalline silicon layer 52 when exposed to the same etch chemistry. Preferably, insulating layer 54 comprises a silicon oxide. Insulating layer 54 may be formed using any appropriate process steps and materials, including oxidation and/or deposition techniques as are known, such as thermal deposition, chemical vapor deposition (CVD), low pressure chemical vapor deposition (LPCVD), plasma enhanced chemical vapor deposition (PECVD), or atomic layer deposition (ALD) and has a thickness in the range of about 50 to about 200 nm, preferably about 100 nm. A hard mask material layer 66 is deposited overlying insulating layer 54. Hard mask material layer 66 may comprise any suitable hard mask material that has an etch rate that is different from the material of insulating layer 54 when exposed to the same etch chemistry. For example, if insulating layer 54 comprises a silicon oxide, hard mask material layer 66 may comprise silicon nitride, silicon-rich silicon nitride, or a silicon oxynitride. In an exemplary embodiment of the present invention, hard mask material layer 66 has a thickness in the range of about 10 to about 50 nm, preferably about 20 nm.

Figure 3:
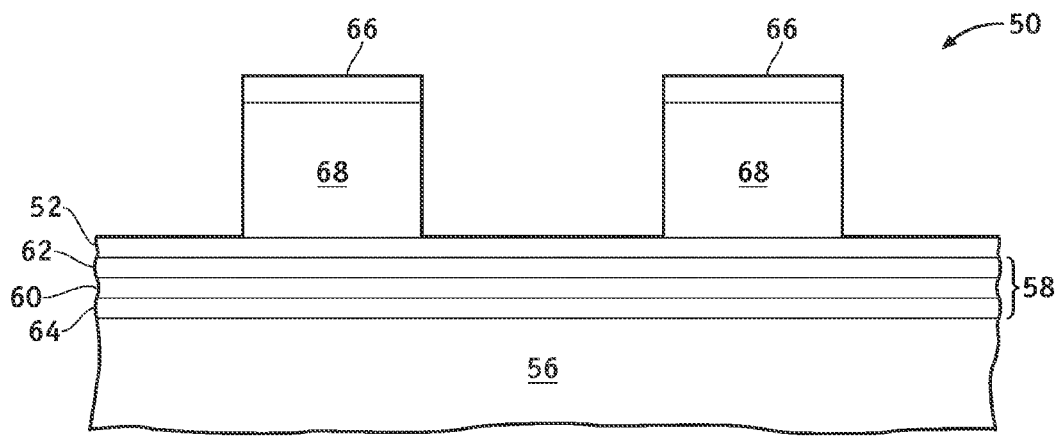
Figure 4:
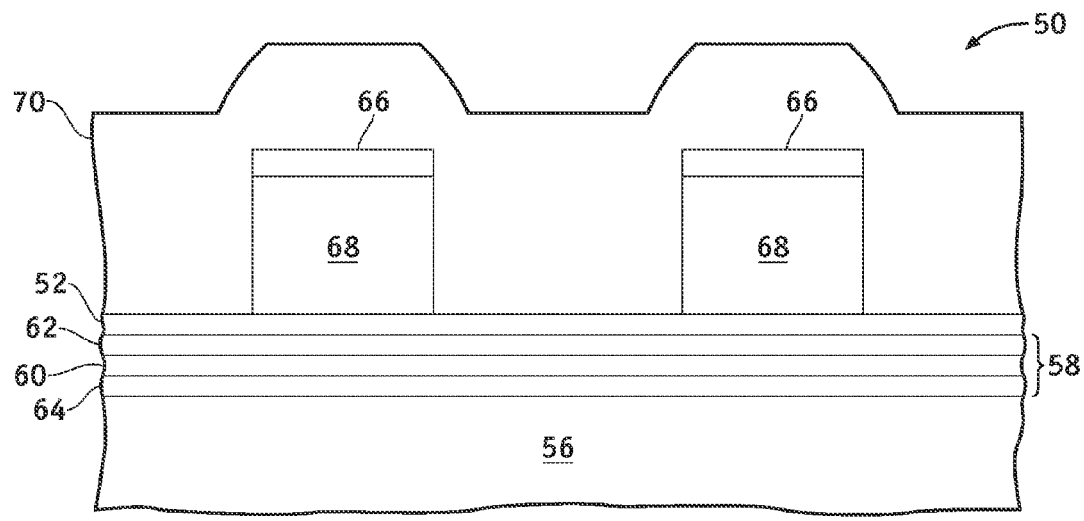

Referring to FIG. 3, hard mask layer 66 is patterned using conventional photolithography methods. Insulating layer 54 then is subjected to an anisotropic etch to form a plurality of insulating members 68 and to expose a portion of polycrystalline silicon layer 52. Preferably, insulating layer 54 is etched by plasma etching. While FIG. 3 illustrates only two insulating members, it will be understood that any suitable number of insulating members may be formed depending on the number of memory cells desired. A blanket layer of polycrystalline silicon 70 is deposited overlying the insulating members 68 and the exposed portion of polycrystalline silicon layer 52, as illustrated in FIG. 4. The polycrystalline silicon can be deposited, for example, by the reduction of silane in a chemical vapor deposition (CVD) reaction and preferably is deposited to a thickness of 100 nm.

Figure 5:
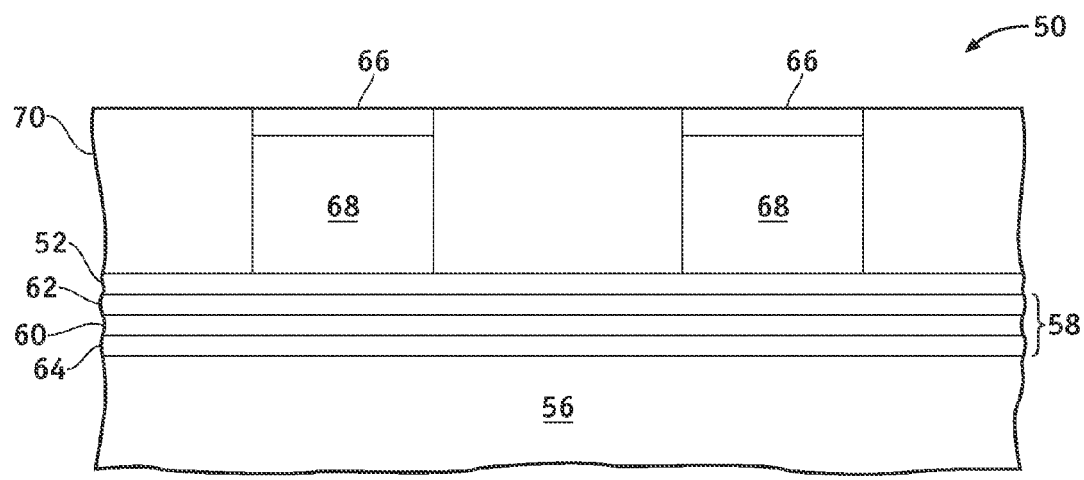
Figure 6:
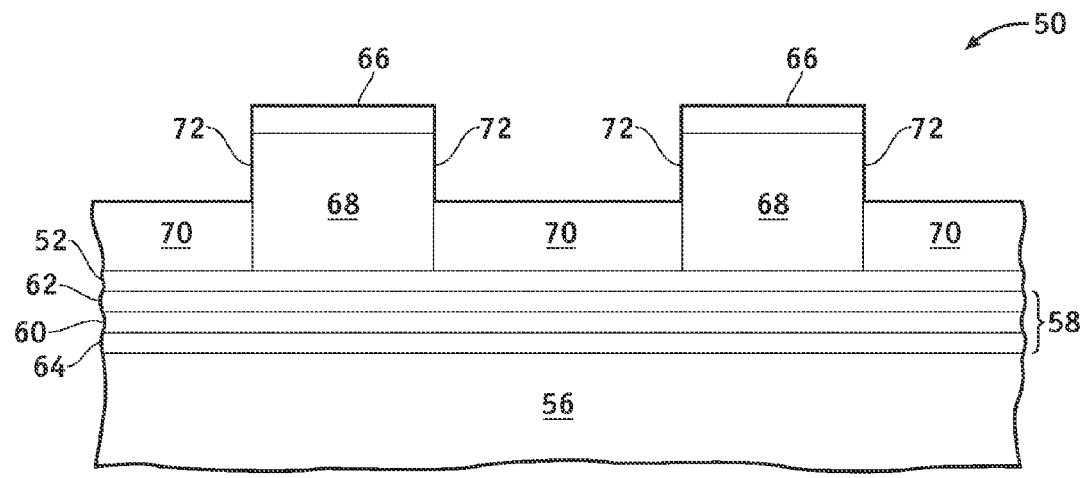

A portion of the polycrystalline silicon layer 70 is removed to expose hard mask material layer 66 and a portion of insulating members 68. In one exemplary embodiment of the present invention, a first portion of the polycrystalline silicon layer 70 may be removed by chemical mechanical planarization (CMP), electrochemical mechanical planarization (ECMP) or the like, to expose hard mask material layer 66, as illustrated in FIG. 5. A second portion of the polycrystalline silicon layer subsequently can be removed by a suitable plasma etch to expose portions of sidewalls 72 of insulating members 68, as illustrated in FIG. 6. In an alternative embodiment of the invention, the first and second portions of the polycrystalline silicon layer 70 may be removed by a plasma etch. In an exemplary embodiment of the invention, about half of the polycrystalline silicon layer 70 is removed during the removal process(es).

Figure 7:
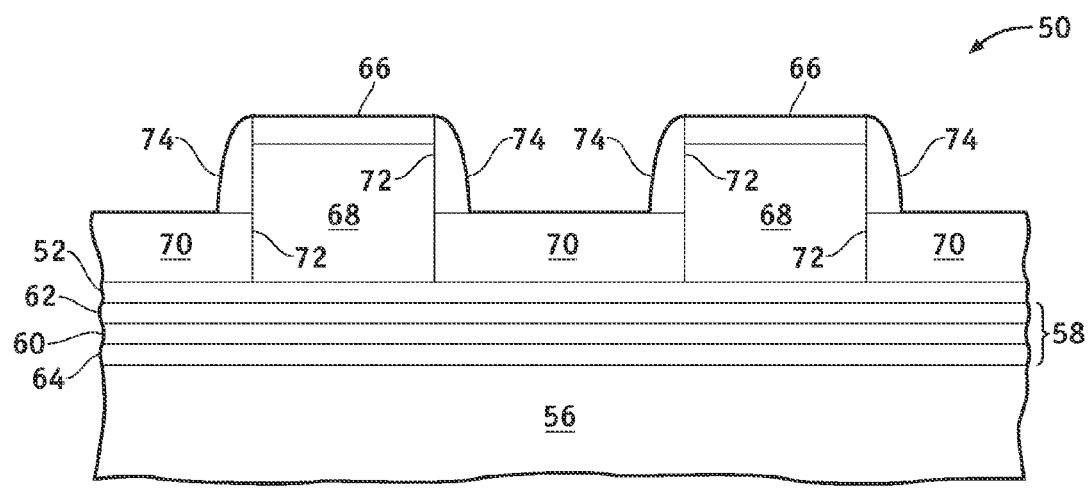
Figure 8:
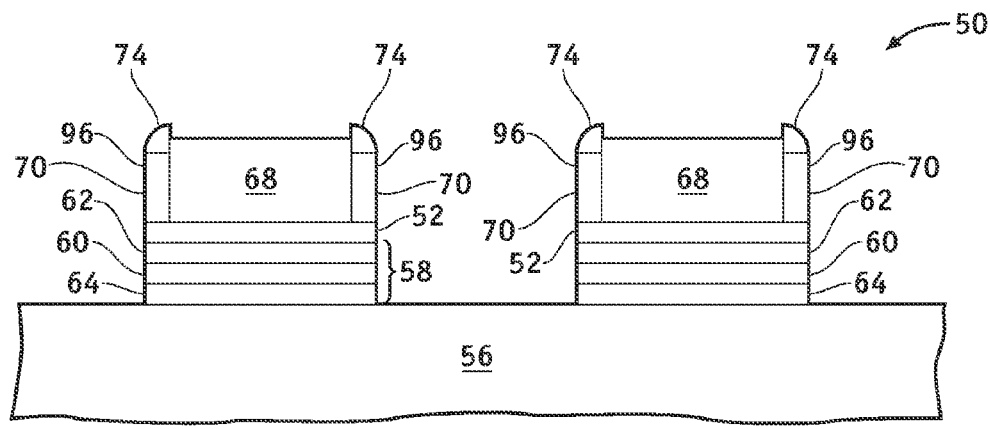

Referring to FIG. 7, a layer of material that is different from the material of polycrystalline silicon layer 70, such as, for example, a silicon nitride, is conformally deposited overlying memory device 50 and is etched to form sidewall spacers 74 about the exposed portions of sidewalls 72 of insulating members 68. Using sidewall spacers 74 as an etch mask, polycrystalline silicon layer 70, polycrystalline layer 52, second insulating layer 62, charge trapping layer 60, and first insulating layer 64 are etched by an anisotropic etch process(es), thus exposing substrate 56, as illustrated in FIG. 8. During the etching, hard mask material layer 66 also is removed. As will be appreciated, by utilizing insulating members 68 and by etching polycrystalline silicon layer 70 using sidewall spacers 74 as an etch mask, polycrystalline gate structures 96 with substantially vertical sidewalls are formed from polycrystalline silicon layer 70. As used herein, the term "vertical" means substantially perpendicular to a surface of the substrate 56. In addition, using sidewall spacers 74 as an etch mask provides more control over the length of polycrystalline gate structures 96, as this process is independent of lithography. In this regard, resulting charge storage nodes, discussed in more detail below, will have substantially consistent length.

Figure 9:
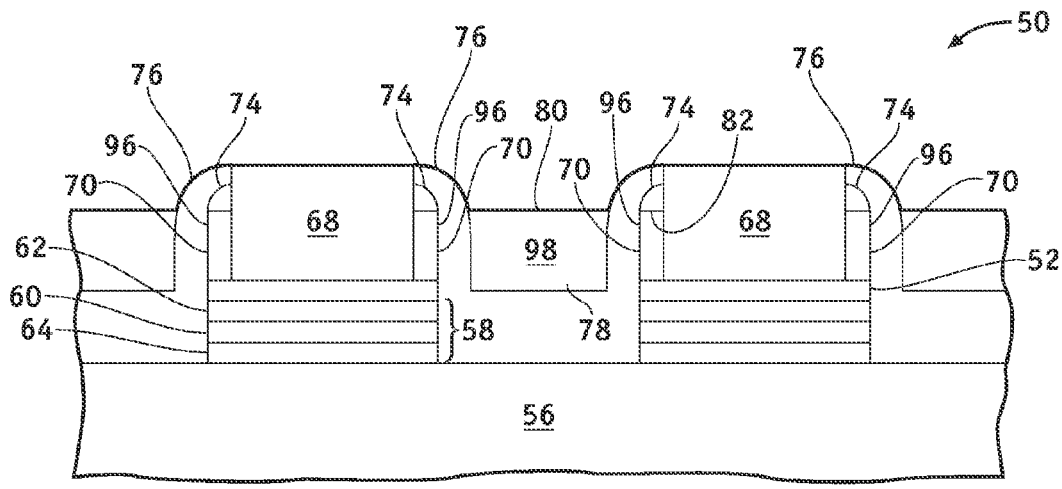

Referring to FIG. 9, a third insulating layer 76 is conformally deposited onto memory device 50. Deposition of third insulating layer 76 may be followed by a thermal anneal to densify the layer. After formation of the third insulating layer, a polycrystalline silicon layer 78 is deposited overlying the third insulating layer 76. Preferably, the polycrystalline silicon layer 78 is deposited to a thickness of about 50 nm. The polycrystalline silicon layer 78 then is etched by plasma etch to expose insulating members 68 and form a polycrystalline silicon gate spacer 98. In an exemplary embodiment of the present invention, a slight overetching of polycrystalline silicon layer 78 may be performed so that an exposed surface 80 of gate spacer 98 is approximately planar with a surface 82 of polycrystalline silicon layer 70. As illustrated below, third insulating layer 76 will serve as a gate insulator between two complimentary charge storage nodes. Accordingly, third insulating layer 76 may be formed of any suitable material and may be deposited to any suitable thickness depending on desired memory device characteristics. In an exemplary embodiment of the present invention, the third insulating layer 76 is a silicon oxide layer that is deposited to a thickness in the range of about 10 to 50 nm, preferably about 20 nm.

Figure 10:
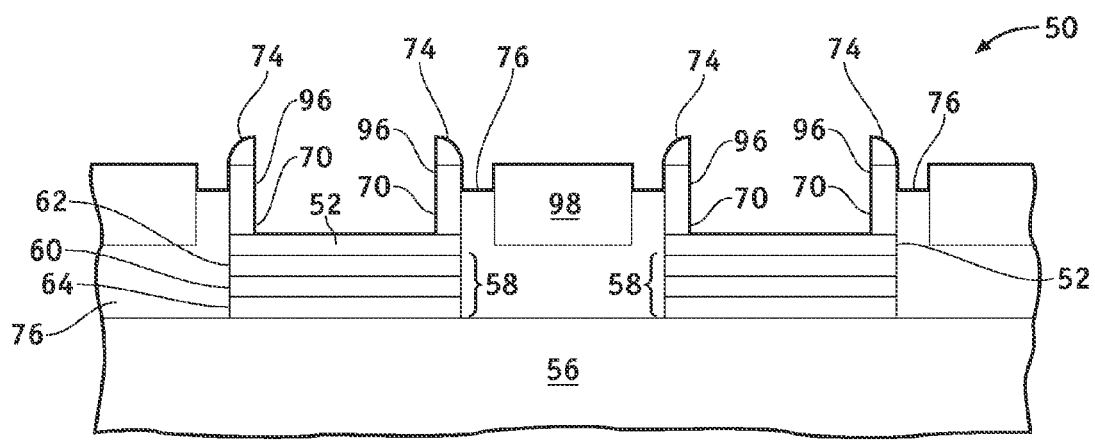

After etching of polycrystalline silicon layer 78, a portion of third insulating layer 76 and substantially all of insulating members 68 are removed to expose polycrystalline silicon layer 52, as illustrated in FIG. 10. In an exemplary embodiment of the invention, the etch process comprises a wet etch, preferably removing about 20 nm of third insulating layer 76, followed by a plasma etch, preferably removing about 50 nm of third insulating layer 76. In an alternative exemplary embodiment of the invention, the etch process comprises a wet etch of about 70 nm of third insulating layer 76.

Figure 11:
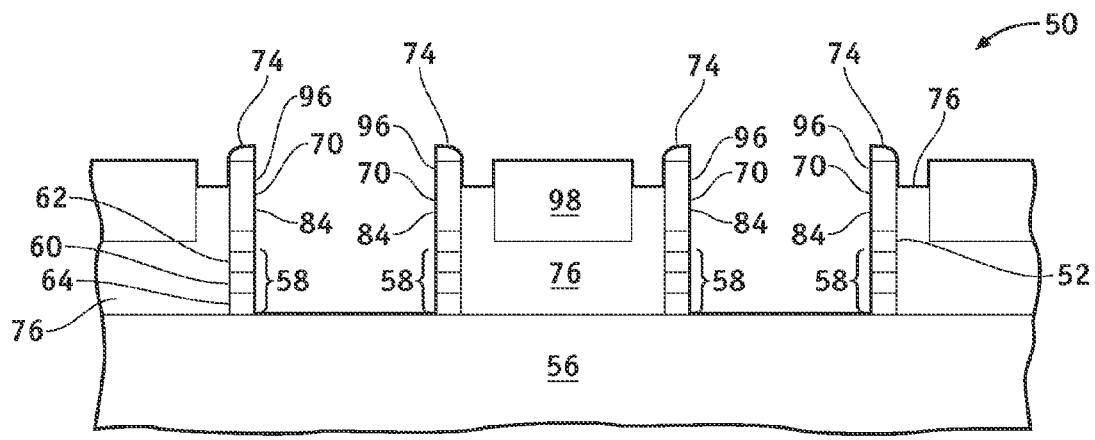

Referring to FIG. 11, upon etching of insulating members 68, polycrystalline silicon layer 52 and multi-layer stack 58 are anisotropically etched, with sidewall spacers 74 serving as etch masks, to form charge storage nodes or bits 84. In this regard, third insulating layer 76, which will serve as a gate insulator between complimentary charge storage nodes 84, and multi-layer stack 58 of the charge storage nodes 84 can be formed independently, thus providing flexibility in the design of memory device 50. In one exemplary embodiment of the invention, after etching of multi-layer stack 58, a portion of sidewall spacers 74 remains overlying polycrystalline silicon layer 70, as shown in FIG. 11. In another exemplary embodiment of the invention, sidewall spacers 74 are etched substantially away during the etching of multi-layer stack 58. If remaining, the sidewall spacers then are removed.

Figure 12:
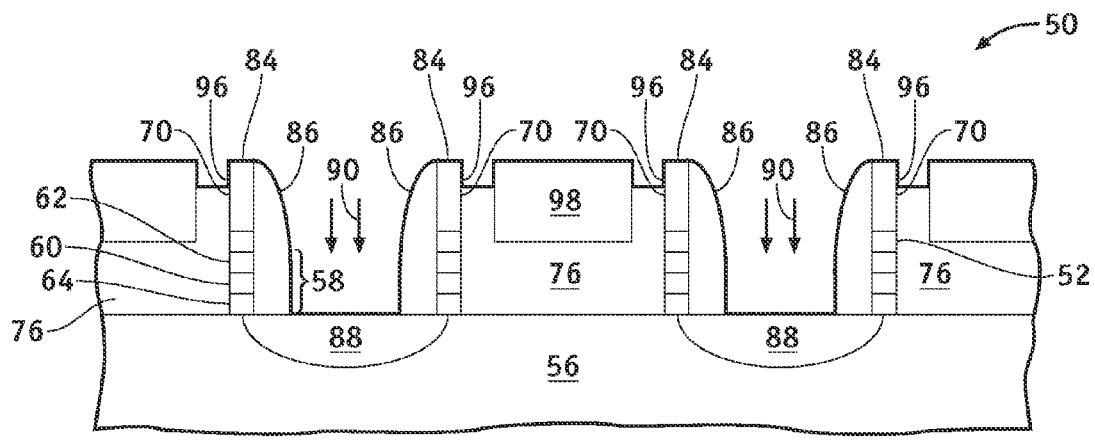

A layer of gate spacer material is deposited overlying memory device 50 and is anisotropically etched to form gate spacers 86 adjacent to memory nodes 84 and to expose a portion of substrate 56, as illustrated in FIG. 12. The layer of gate spacer material preferably has a different etch characteristic than polycrystalline silicon and more preferably comprises silicon oxide that is deposited to a thickness of about 10 nm or less. Gate spacers 86, memory nodes 84, and third insulating layer 76 then are used as an ion implantation mask and conductivity-determining ions are implanted into semiconductor substrate 56, as indicated by arrows 90, to form bit lines 88 that are aligned to the gate spacers 86. In a preferred embodiment, semiconductor substrate 56 is impurity doped with P-type and N-type ions such as arsenic ions or phosphorus ions to form N-type bit lines.

Figure 13:
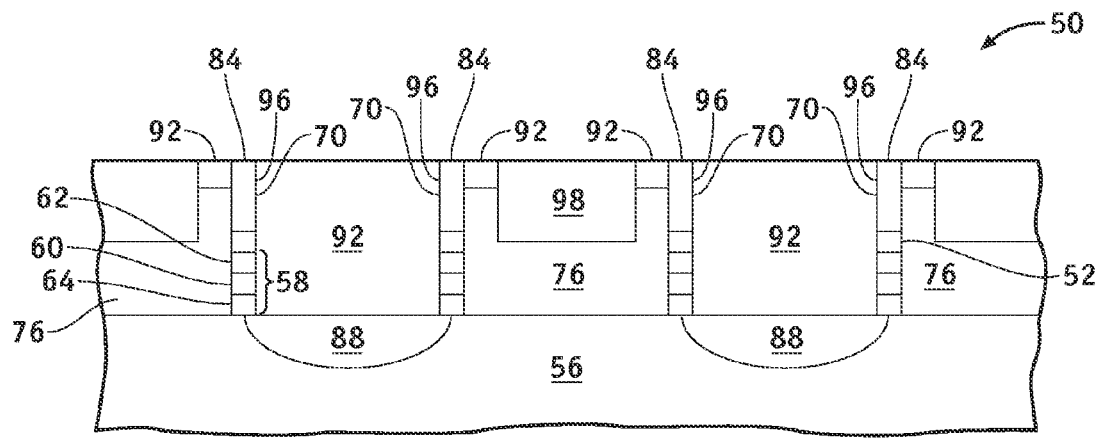

The method in accordance with an embodiment of the invention continues by the deposition of a fourth insulating material 92 overlying the bit lines and filling the gaps between the memory storage nodes 84. The insulating material can be, for example, a deposited silicon oxide, such as a high density plasma (HDP) oxide. Following the deposition, the top surface of insulating material 92 can be planarized by CMP to expose the top portion of memory storage nodes 84 and gate spacer 98, as illustrated in FIG. 13. In a preferred embodiment of the invention, the CMP process step is followed by an etch step to remove a portion of insulating material 92 and to fully expose the tops of memory storage nodes 84 and gate spacer 98. If the insulating material is a silicon oxide, the etch step can be accomplished by a dip in a dilute HF solution.

Figure 14:
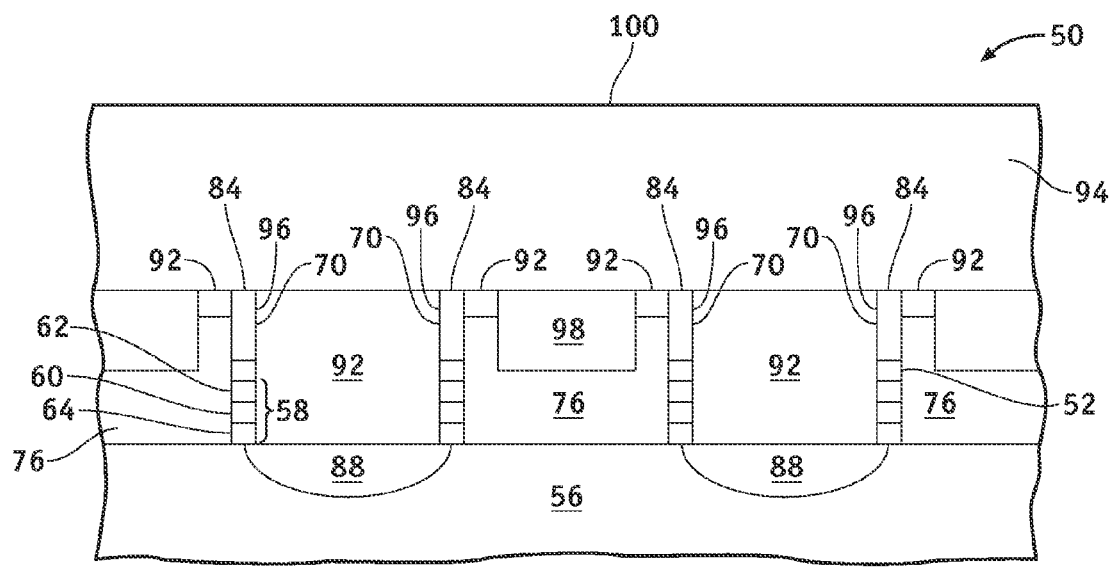

As illustrated in FIG. 14, the method in accordance with one embodiment of the invention is continued by depositing a blanket layer 94 of polycrystalline silicon or other conductive material in contact with the exposed tops of memory storage nodes 84 and gate spacer 98. The blanket layer is preferably deposited as an impurity doped layer of polycrystalline silicon or can be deposited as a polycrystalline silicon that is subsequently doped by ion implantation. Although not seen in this cross sectional view, blanket layer 94 is photolithographically patterned and etched to form a word line 100 physically coupled to memory storage nodes 84 and polycrystalline spacer 78.

Those of skill in the art will appreciate that a completed memory device will include isolation such as shallow trench isolation between devices that need to be electrically isolated, electrical contacts to the bit lines and to the word lines, bit line drivers, word line drivers, clock circuits, address decoding circuits and the like. Fabrication of such structural and circuit elements can be easily integrated with the method for fabricating the memory cell structure that has been described herein to fabricate a complete semiconductor memory device.

Accordingly, methods for fabricating dual bit memory devices have been provided. Because the methods provide for independent fabrication of the multi-layer stack and the gate insulator, both can be designed with greater flexibility. Charge storage nodes are defined using sidewall spacers that are formed independently of lithography, such that the charge storage node length is free from lithography variations. Further, in accordance with the various embodiments of the methods, the charge storage nodes are formed in a manner such that the sidewalls of the gate structures of the nodes are substantially vertical. Thus, subsequent etching processes such as word line etch processes are not adversely affected by "shadowing" resulting from non-vertical sidewalls of the gate structures of the nodes. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A nonvolatile semiconductor memory device comprising:
   a semiconductor substrate;
   two spaced-apart charge storage nodes disposed on the substrate;
   two spaced-apart bitline regions disposed within the substrate, wherein each of the two spaced-apart bitline regions is in electrical contact with one of the two spaced-apart charge storage nodes;
   a gate insulator disposed on the substrate between the two spaced-apart charge storage nodes;
   a gate spacer disposed on the gate insulator and between the two spaced-apart charge storage nodes; and
   a word line in physical contact with the gate spacer and the two spaced-apart charge storage nodes.

2. The nonvolatile semiconductor memory device of claim 1, wherein the two spaced-apart charge storage nodes have substantially vertical sidewalls.

3. The nonvolatile semiconductor memory device of claim 1, wherein the two spaced-apart charge storage nodes each comprises a charge trapping layer and a gate structure overlying the charge trapping layer.

4. The nonvolatile semiconductor memory device of claim 3, wherein the charge trapping layer is comprised of silicon-rich silicon nitride, silicon nitride, polycrystalline silicon, or a combination thereof.

5. The nonvolatile semiconductor memory device of claim 3, wherein the gate structure is comprised of polycrystalline silicon.

6. The nonvolatile semiconductor memory device of claim 1, wherein the gate spacer is comprised of polycrystalline silicon.

* * * * *